United States Patent
Cheng et al.

(10) Patent No.: US 6,859,594 B2
(45) Date of Patent: Feb. 22, 2005

(54) COLOR DISPLAY DEVICE FABRICATED WITH LIGHT EMITTING POLYMER (LEP) FIBER CONTROLLED BY IMAGE DISPLAY SIGNALS

(75) Inventors: Bruce C. H. Cheng, Hsinchu (TW); Chun-Hui Tsai, Hsinchu (TW)

(73) Assignee: Delta Optoelectronics Company, Hsinchu (TW)

( * ) Notice: Subject to any disclaimer, the term of this patent is extended or adjusted under 35 U.S.C. 154(b) by 538 days.

(21) Appl. No.: 09/881,953

(22) Filed: Jun. 15, 2001

(65) Prior Publication Data

US 2002/0031315 A1 Mar. 14, 2002

Related U.S. Application Data

(60) Provisional application No. 60/212,158, filed on Jun. 16, 2000.

(51) Int. Cl.$^7$ ................................................. G02B 6/04
(52) U.S. Cl. ........................................ 385/120; 385/115
(58) Field of Search ............................... 385/120, 147, 385/901

(56) References Cited

U.S. PATENT DOCUMENTS

| | | | | | |
|---|---|---|---|---|---|
| 5,747,928 A | * | 5/1998 | Shanks et al. | ............... | 313/498 |
| 5,962,967 A | * | 10/1999 | Kiryuschev et al. | ......... | 313/491 |
| 6,046,720 A | * | 4/2000 | Melville et al. | ............. | 345/108 |
| 6,490,402 B1 | * | 12/2002 | Ota | ............................ | 385/147 |

* cited by examiner

*Primary Examiner*—Phan T. H. Palmer
*Assistant Examiner*—Jennifer Doan
(74) *Attorney, Agent, or Firm*—Bo-In Lin

(57) ABSTRACT

The present invention discloses a color display system. The color display system includes a plurality of light emitting polymer (LEP) optical fibers each formed as plurality of light-emitting segments for emitting a specific color by using a special light emitting polymer. The light emitting segments are arranged as a two-dimensional array with each of the light emitting segments controlled to turn on and off for presenting a color image by turning on a plurality of the light emitting segments. In a preferred embodiment, each of the light emitting segments includes an indium/tin oxide (ITO) layer segment covering the LEP optical fiber wherein each of the ITO segments is connected to an ITO control voltage for turning on and off the light emitting segment.

8 Claims, 2 Drawing Sheets

COLOR DISPLAY DEVICE FABRICATED WITH LIGHT EMITTING POLYMER (LEP) FIBER CONTROLLED BY IMAGE DISPLAY SIGNALS

This Application claims a Priority Filing Date of Jun. 16, 2000 benefited from a previously filed Provisional Application 60/212,158.

BACKGROUND OF THE INVENTION

1. Field of the Invention

This invention relates generally to the structure and fabrication process of an optical fiber system with light emitting polymer (LEP) light source. More particularly, this invention relates to a new and improved color display device employing optical fiber with light emitting polymer (LEP) as light source.

2. Description of the Prior Art

A technical difficulty is still confronted by the manufacturers of image display system to produce display panel that can be flexibly folded and carried around. Even with the advances made in image display technologies such as the liquid display panels are becoming thinner and lighter, however, improvement of portability is still lag behind. This is particularly true with display systems that has larger screen, a form factor generated by the large area inherent as part of the dimension of the screen, create great deal of difficulties to make a display system more portable.

Therefore, a need still exists in the art of design and manufacture of color image display by employing the light emitting polymers to make improved display system such that the limitations as now encountered can be overcome. More specifically, a need still exists in the art to provide an image display system that has a flexible display panel provided with color pixels for displaying color images where the on-off and combinations of the color pixels can be effectively controlled by image signals. It is also desirable that such flexible panel can be conveniently manufactured with existing technologies for making integrated circuits (ICs) and controllable with signal process scheme that can be easily implemented with either existing software or hardware capabilities. The production of such flexible display panel can therefore be maintained at a reasonable low cost and can be easily mass-produced to satisfy demands of large quantity supplies.

SUMMARY OF THE PRESENT INVENTION

It is therefore an object of the present invention to provide a new light emitting polymer (LEP) optical fiber configuration to produce two dimensional array of color display optical fiber segments. Each of these light-emitting segments can be independently controlled to turn on and off for displaying color image according to an image control signal. The LEP optical fibers are supported and securely attached to a flexible substrate such that the display panel is foldable and become conveniently portable such that aforementioned difficulties and limitations encountered in the prior art can now be overcome.

Specifically, it is an object of the present invention to provide an improved method for fabrication a plurality of LEP optical fibers to configure and assembly these LEP optical fibers into two dimensional display array. This two dimensional array formed by flexibly foldable LEP optical fibers are controllable through image display signals for emitting red, green and blue (RGB) colors according to predefined sequences and combinations to achieve a color image display.

Another object of the present invention is to provide a new and improved color image display system by making use of LEP optical fibers taking advantages of modern IC manufacture technologies. The LEP optical fibers can be manufactured with IC processing technology with interconnection traces for controlling the on and off of miniaturized segments functioning as color pixels. The trace connection configuration and signal control algorithm and method of circuit implementation are very similar to the on-and-off control of memory cells for reading and writing data such that the image display signal control can be very conveniently implemented by making use of well known and exiting control techniques.

Another object of the present invention is to provide a new and improved color image display system by making use of LEP optical fibers to achieve better display with finer resolution and better signal processing and control technology. Specifically, the display elements made form the LEP optical fibers can be made with very high resolution and the frequency of light emitting cycles can be increased many folds than what can be achieved with current technology. These better and higher performance can be easily achieved because of the basic reasons that these light emitting segments (or elements) formed on the LEP fiber are manufactured with IC technology and the control algorithms are very similar to the control methods used for memory access. Existing technologies are developed to a very high degree of performance which can be easily implemented in image display system according to the LEP color display system disclosed in this invention.

Briefly, in a preferred embodiment, the present invention includes a color display system. The color display system includes a plurality of light emitting polymer (LEP) optical fibers each formed as plurality of light-emitting segments for emitting a specific color by using a special light emitting polymer. The light emitting segments are arranged as a two-dimensional array with each of the light emitting segments controlled to turn on and off for presenting a color image by turning on a plurality of the light emitting segments. In a preferred embodiment, each of the light emitting segments includes an indium/tin oxide (ITO) layer segment covering the LEP optical fiber wherein each of the ITO segments is connected to an ITO control voltage for turning on and off the light emitting segment.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
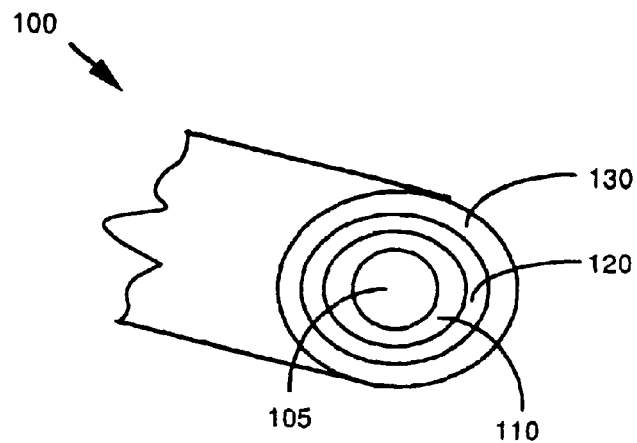
FIG. 1 is a light-emitting polymer implemented in this invention for making a color image display panel.
Figure 2:
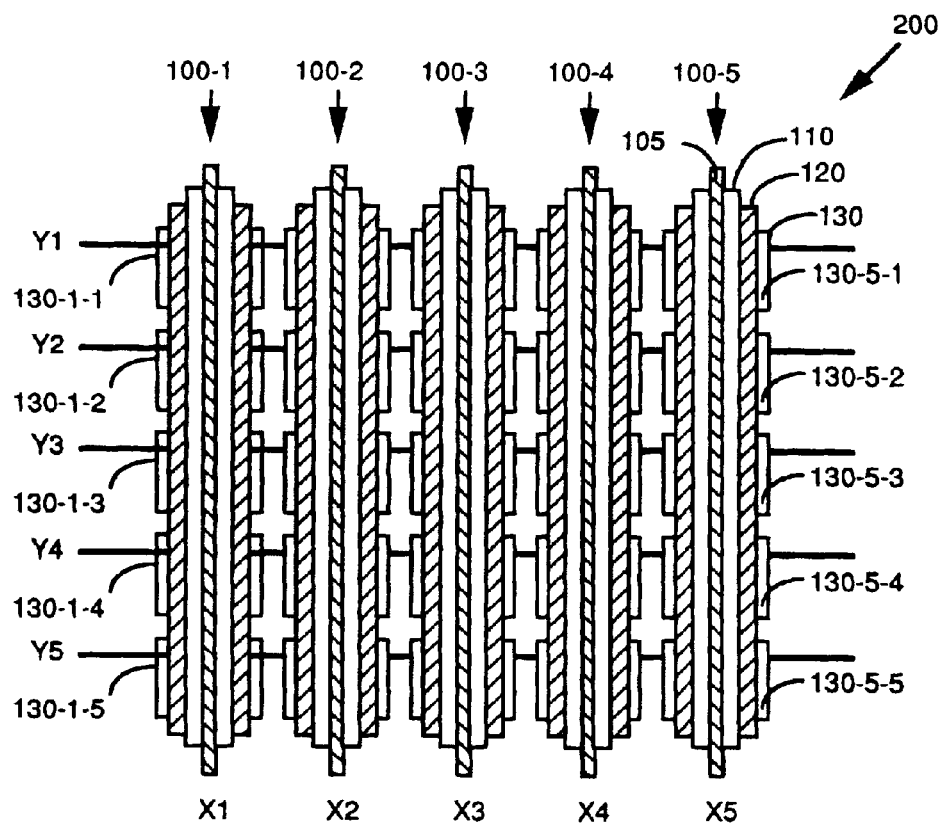
FIG. 2 is a cross sectional view of an array of LEP optical fiber light-emitting segments controllable by a two dimensional signal input lines for color image display

FIG. 1 is a cross sectional view of a light emitting polymer (LEP) optical fiber 100. The LEP optical fiber is supported on an optical fiber 105 commonly formed with a material generally employed as a glass substrate. A metal layer 110 is then deposited over the top surface of the optical fiber 105 to function as an electrode layer 110. A light emitting polymer (LEP) layer 120 is then coated over the electrode layer 110. The LEP layer is then covered with an indium/tin oxide (ITO) layer 130 to function as a transparent electrode layer 130. The LEP optical fiber as shown in FIG. 2 will emit a light when a voltage, e.g., five volts of voltage, is applied between the metal electrode layer 110 and the ITO layer 130. The color of the light emitted from the light emitting polymer (LEP) outwardly through the transparent ITO layer can be adjusted by employing different kinds of LEP layer 120.

Figure 3:
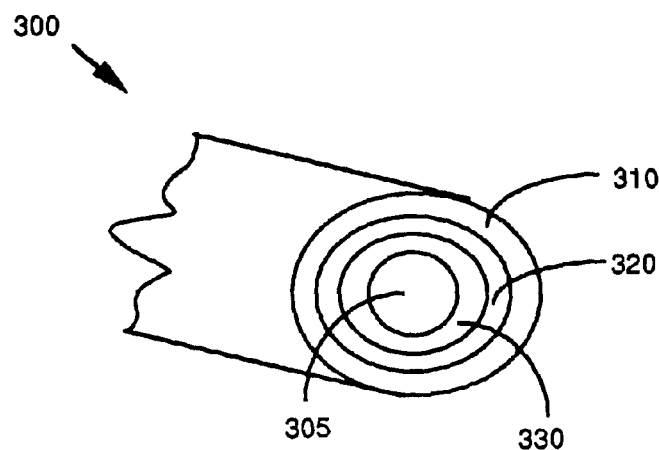
FIG. 3 is another configuration of a light-emitting polymer optical fiber employed in this invention for making LEP optical fiber color display panel as shown in FIG. 1.

FIG. 2 is a side cross sectional view of a LEP optical fiber color display system 200 manufactured with the LEP optical fiber 100 shown in FIG. 1. As shown in FIG. 2, the color display 200 is manufactured with a plurality of LEP optical fiber 100-1, 100-2, 100-3, . . . 100-N. In FIG. 3, an example is shown which has five LEP optical fibers 100-1 to 100-5 extended vertically. The metal electrode layers of these LEP optical fibers are connected to an optical fiber voltage controller for controlling the voltage input applied to five input ports X1, X2, X3, X4, and X5. Each of these LEP optical fibers is formed with multiple segments with each of these segments formed with an ITO layer-segment, e.g., 130-1-1, 130-1-2, . . . 130-5-5 as shown in FIG. 3. Each of these ITO segments warps around the LEP optical fiber and connected to five horizontal control lines Y1, Y2, Y3, Y4, and Y5. The five vertical input voltage control ports X1 to X5 and the five control lines Y1 to Y5 are employed to selectively applied a voltage between the metal electrode layer 110 and the selected ITO segments 130-I-J. By controlling the voltage applied to X1 to X5 and Y1 to Y5, a set of selected segment of LEP optical fiber 100-1 to 100-5 wrapped by the selected ITO segments 130-1-J emit a light of specific color. These segments emitting lights of pre-defined color can be employed for making color display. Each of these ITO segments becomes a color display pixel with predefined color by using specific kind of light emitting polymer. Each ITO segment layer 130-I-J can be arranged as a red (R), green (G), and blue (B) for combining into different colors. An image display can therefore be displayed by control the on and off of the vertical and horizontal voltage control lines. The control scheme would be similar to that of a two dimension array of control lines, e.g., the word lines and bit lines, of a memory device comprises memory cells formed as a two dimensional array controlled by word lines and bit lines.

According to FIGS. 2 and 3, and above descriptions, this invention discloses a color display system. The color display system includes a plurality of light emitting polymer (LEP) optical fibers each formed as plurality of light-emitting segments for emitting a specific color by using a special light emitting polymer. The light emitting segments are arranged as a two-dimensional array with each of the light emitting segments controlled to turn on and off for presenting a color image by turning on a plurality of the light emitting segments. In a preferred embodiment, each of the light emitting segments includes an indium/tin oxide (ITO) layer segment covering the LEP optical fiber wherein each of the ITO segments is connected to an ITO control voltage for turning on and off the light emitting segment. In a preferred embodiment, each of the LEP optical fiber is supported on an glass fiber core carrier covered by a metal electrode layer, and the metal electric layer is further covered by a light emitting polymer (LEP) layer. The ITO layer segments coated over the LEP layer such that a voltage applied between the metal electrode layer and a selected ITO layer segment turns on a selected light emitting segment covered by the selected ITO layer segment. The applied voltage is for emitting a light from the LEP layer to project outwardly through the selected ITO layer segment. In a preferred embodiment, each of the metal electrode layer for each of the LEP optical fiber is connected to a set of metal electrode control voltage to function with the ITO control voltage to turn on and off each of the light emitting LEP optical fiber segments. In a preferred embodiment, the plurality of light-emitting segments are arranged to emit lights of red, green and blue colors for image display over the two dimensional array. In another preferred embodiment, the plurality of light-emitting segments formed with the plurality of LEP optical fibers are supported on a flexible planar substrate to form a flexibly foldable color display system.

The color display pixels formed with segmented ITO layer segments 130-I-J wrapping around the LEP optical fiber can be formed by sputter the ITO onto the LEP optical fiber with a mask. The sputtering process is applied for coating the ITO layer as a segmented ITO layer and also to form the horizontal extension 130-I-J-H as that shown in FIG. 3. For each ITO segment layer 130-J1 connected to the extension 130-I-J-H, a horizontal connection line, e.g., Y1 to Y5, is formed for controlling the voltages applied to the ITO segment layer 130-I-J. This color display 200 can be formed with the ITO segment extensions 130-I-J-H attached to a flexible support such that this color display system 200 may be wrapped or folded as an conveniently portable display system.

FIG. 3 shows another embodiment of a light emitting polymer (LEP) optical fiber 300 formed on a glass fiber carrier 305 covered by a transparent ITO layer 330. A light emitting polymer 320 wraps around the ITO layer 330 and covered by an external metal electrode layer 310. When a voltage is applied between the external metal layer 310 and the ITO layer 330, a light is emitted inwardly to light up the glass fiber carrier 305. Again, using different kinds of light emitting polymer (LEP), the light emitted inwardly to the glass fiber carrier 305 may be of different colors depending on the LEP used.

Figure 4:
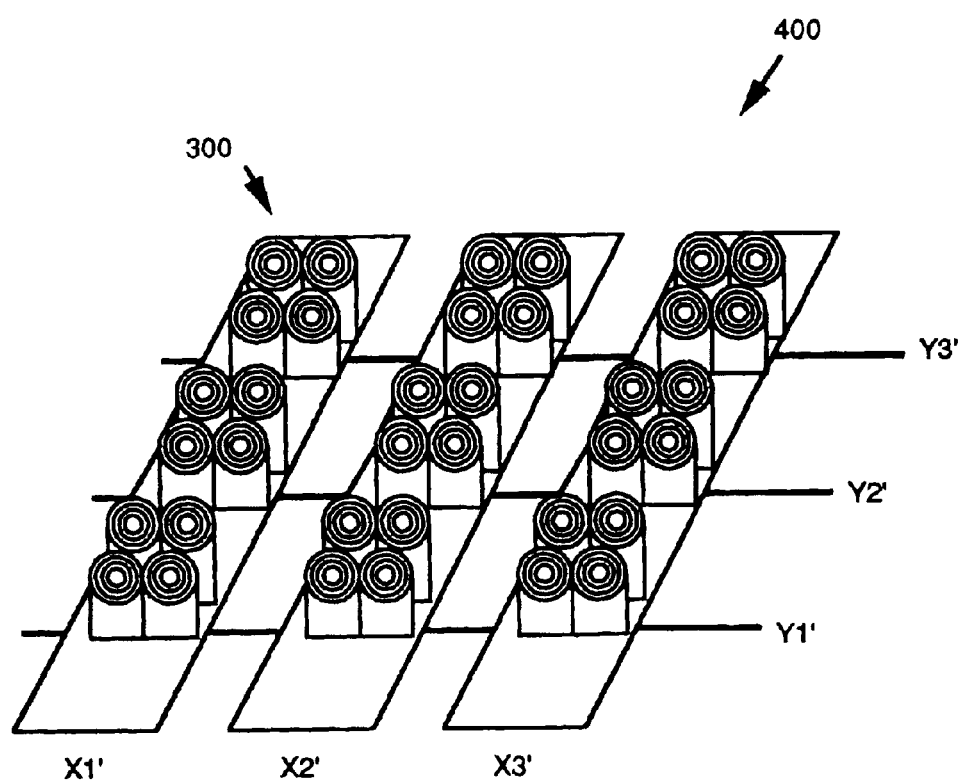
FIG. 4 is a perspective view of another color display system formed with a plurality of LEP light emitting segments each controlled by X-Y array of control lines in responding to image display signals.

FIG. 4 shows a color display system 400 manufactured with the LEP optical fibers 300 shown in FIG. 4. Segment of LEP optical fibers 300 are supported on a flexible foldable substrate. The metal electrode and the ITO layer for each of these LEP optical fiber segments are connected to a set of horizontal and vertical control lines X1' to X3' and horizontal control lines Y1' to Y3'. The vertical and horizontal control lines can be programmed to turn on combinations of different LEP optical fiber segments 300 for presenting color images wherein one or several of the LEP optical fiber segments can be employed as a color display pixel.

According to FIGS. 1 to 4, this invention discloses a method for configuring a color display system. The method includes steps of forming a plurality of light-emitting segments on a plurality of light emitting polymer (LEP) optical fibers for emitting a segment-specific color by using a special light emitting polymer. The method further includes a step of arranging the light emitting segments as a two-dimensional array with each of the light emitting segments controlled to turn on and off for presenting a color image by turning on a plurality of the light emitting segments. In a preferred embodiment, the step of forming the plurality of light-emitting segments further comprising a step of covering each of the light emitting segments of the LEP optical fibers with an indium/tin oxide (ITO) layer segment. And, connecting each of the ITO layer-segments to an ITO control voltage for turning on and off the light emitting segment. In another preferred embodiment, the method further includes a step of supporting each of the LEP optical fibers on an substrate carrier covered by a metal electrode layer provided with conductive traces. The method further includes a step of connecting the ITO layer segments to a corresponding conductive trace whereby a voltage applied between the metal electrode layer and a selected ITO layer segment turning on a selected light emitting segment covered by the selected ITO layer segment for emitting a light from the LEP layer to project outwardly through the selected ITO layer segment. In another preferred embodiment, the method further includes a step of connecting each of the metal traces to a color image display controller for selectively turning on and off each of light-emitting segments. In another preferred embodiment, the step of forming a plurality of light-emitting segments further comprising a step of forming the light emitting segments to emit lights of red, green and blue colors for image display over the two dimensional array. In another preferred embodiment, the step of forming a plurality of light-emitting segments further comprising a step of supporting the plurality of light-emitting segments on a flexible planar substrate to form a flexibly foldable color display system.

According to FIGS. 1 and 2, this invention further discloses a method of forming a color display system. The method includes a step of forming a plurality light emitting segments by employing a plurality of light emitting optical fibers with each segment emitting a specific color by using a special light emitting optical fiber material. The method further includes another step of arranging the light emitting segments as a two-dimensional array with each of the light emitting segments controlled to turn on and off for presenting a color image by turning on a plurality of the light emitting segments.

According to FIGS. 3 and 4, this invention further discloses a method of configuring a color imaging system. The method includes a step of providing a plurality of light emitting optical fibers each having a light emitting-end for emitting a color pixel of a specific color by using a special light emitting optical fiber material. The method further includes a step of arranging the light emitting-end as a two-dimensional array with each of the light emitting optical fibers controlled to turn on and off for presenting a color image by turning on a plurality of the light emitting-ends. In a preferred embodiment, the method further includes a step of wrapping around each of the light emitting optical fibers with an indium/tin oxide (ITO) layer wherein the ITO layer is connected to an ITO control voltage for turning on and off the light emitting-end. In another preferred embodiment, the step of wrapping each of the optical fibers with the ITO layer further comprising step of wrapping an electrode layer around the ITO layer for applying an ITO control voltage thereon. The method further comprising a step of providing a substrate carrier with metal traces for connecting to the electrode layer of the optical fibers for turning on and off the light-emitting ends.

A color display system is disclosed in this invention. The color display system includes a plurality of light emitting optical fibers each formed as plurality of light emitting segments for emitting a specific color by using a special light emitting optical fiber material. The light emitting segments arranged as a two-dimensional array with each of the light emitting segments controlled to turn on and off for presenting a color image by turning on a plurality of the light emitting segments. Furthermore, the structure and method of employing the light emitting optical fibers according to the above descriptions can also be applied for the manufacture of a printer head and other types of color image system. Therefore, the invention further discloses an image system formed with the structure ad described according the general principles presented in FIGS. 1 to 4.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A color display system comprising:

a plurality of light emitting polymer (LEP) optical fibers each formed as plurality of light-emitting segments for emitting a specific color by using a special light emitting polymer;

said light emitting segments arranged as a two-dimensional array with each of said light emitting segments controlled to turn on and off for presenting a color image by turning on a plurality of said light emitting segments;

each of said light emitting segments comprising an indium/tin oxide (ITO) layer segment covering said LEP optical fiber wherein said each of said ITO segments is connected to an ITO control voltage for turning on and off said light emitting segment.

each of said LEP optical fiber is supported on an glass fiber core carrier covered by a metal electrode layer, and said metal electric layer is further covered by a light emitting polymer (LEP) layer; and said ITO layer segments coated over said LEP layer whereby a voltage applied between said metal electrode layer and a selected ITO layer segment turning on a selected light emitting segment covered by said selected ITO layer segment for emitting a light from said LEP layer to project outwardly through said selected ITO layer segment.

2. The color display system of claim 1 wherein:

each of said metal electrode layer for each of said LEP optical fiber is connected to a set of metal electrode control voltage to function with said ITO control voltage to turn on and off each of said light emitting LEP optical fiber segments.

3. The color display system of claim 1 wherein:

said plurality of light-emitting segments are arranged to emit lights of red, green and blue colors for image display over said two dimensional array.

4. The color display system of claim 1 wherein:

said plurality of light-emitting segments formed with said plurality of LEP optical fibers are supported on a flexible planar substrate to form a flexibly foldable color display system.

5. A method for configuring a color display system:

forming a plurality of light-emitting segments on a plurality of light emitting ploymer (LEP) optical fibers and covering each of said light emitting segments of said LEP optical fibers with an indium/tin oxide (ITO) layer-segments to an ITO connecting each of said ITO layer-segments to an ITO control voltage for turning on and off said light emitting segment for emitting a segment-specific color by using a special light emitting polymer;

arranging said light emitting segments as a two-dimensional array with each of said light emitting segments controlled to turn on and off for presenting a color image by turning on a plurality of said light emitting segments;

supporting each of said LEP optical fibers on an substrate carrier covered by a metal electrode layer provided with conductive traces; and connecting said ITO layer segments to a corresponding conductive trace whereby a voltage applied between said metal electrode layer and a selected ITO layer segment turning on a selected light emitting segment covered by said selected ITO layer segment for emitting a light from said LEP layer to project outwardly through said selected ITO layer segment.

6. The method of claim 5 further comprising a step of:

connecting each of said metal traces to a color image display controller for selectively turning on and off each of light-emitting segments.

7. The method of claim 5 wherein:

said step of forming a plurality of light-emitting segments further comprising a step of forming said light emitting segments to emit lights of red, green and blue colors for image display over said two dimensional array.

8. The method of claim 5 wherein:

said step of forming a plurality of light-emitting segments further comprising a step of supporting said plurality of light-emitting segments on a flexable planar substrate to form a flexibly foldable color display system.

* * * * *